Oct. 6, 1964 G. B. FINN, JR 3,151,378

PROCESS FOR THE MANUFACTURE OF PURE TIN ALLOYED CONTACT FOR DIFFUSED SILICON DEVICES

Filed Nov. 1, 1960

INVENTOR.
GEORGE B. FINN, JR.
BY
OSTROLENK, FABER, GERB & SOFFEN
ATTORNEYS

United States Patent Office 3,151,378

Patented Oct. 6, 1964

3,151,378
PROCESS FOR THE MANUFACTURE OF PURE TIN ALLOYED CONTACT FOR DIFFUSED SILICON DEVICES

George B. Finn, Jr., Los Angeles, Calif., assignor to International Rectifier Corporation, El Segundo, Calif., a corporation of California Filed Nov. 1, 1960, Ser. No. 66,458
2 Claims. (Cl. 29—25.3)

This invention relates to a novel process for alloying pure tin by non-eutectic alloying to the surface of the diffused layer of a diffused junction in a silicon device such as a silicon rectifier with substantially no loss of the silicon.

Generally in the past, electrical contact was made to the diffused layers of a silicon device as by plating with nickel or gold or by means of gold or aluminum alloy contacts. In the present invention, pure tin having a purity of at least 99.999% (fine wire pure) is utilized wherein many new and unobvious results follow from the alloying of the pure tin to the surface area or surfaces of the diffused layer in the silicon device.

In the first instance, the silicon-tin binary system has no eutectic so that there will be no undue dissolving of the silicon and no undue limitations on the volume of tin that can be used to form the contact. Secondly, the tin is an electrically neutral impurity so that the junction previously formed by the diffused process will not be affected by the connection of the tin contact.

Next, a true and reproducible alloyed interface is formed as contrasted to plated contacts so that rigid control of the geometry of the device can be attained, this geometry also being unaffected by the diffusion process. It has been found that an exceedingly strong bond is achieved where, for example, on an 0.072" diameter junction, a force of in excess of fifteen pounds was required to break the junction wherein the break actually occurred within the silicon rather than at the alloy junction. This is to be contrasted to a plated contact device which will break at approximately four to five pounds of pull.

The next unusual result achieved by the novel use of pure tin which is alloyed with the diffused junction of the silicon device is that a relatively malleable contact is achieved as contrasted to the relatively brittle contacts formed by alloying with a contact of such material that will form a eutectic with the silicon. Because of this relatively soft alloyed interface, it is possible to use large junction areas without the requirement of additional supporting structure. By way of example, an unsupported contact of as large as ¼" can be formed with the novel soft alloy formed of tin and silicon as contrasted to 0.050" for an aluminum-silicon junction. In addition to this, the contact over the silicon surface is extremely uniform without localized high resistance areas.

The present invention must be distinguished from what would superficially appear to be similar structures and methods of the prior art. The first of these is the alloying process used in actually forming the junction in either silicon or germanium. Typical examples of this are in the use of indium which is alloyed with germanium to form both a junction and an indium contact. In these devices an alloying process is used wherein at about 550° C. approximately10% of the liquid system will be formed of dissolved germanium, while 90% of the liquid will be indium. The germanium-indium phase diagram is well known and can be seen, for example, on page 764 of the text Constitution of Binary Alloys by Max Hanson published by McGraw-Hill Publishing Company in 1958. This process which deals with germanium as contrasted to the silicon device to which the present invention applies shows a typical non-eutectic binary phase diagram of two metals. It is seen, however, that the contact junction of the indium is necessarily limited in manufacture technique by the requirement of the indium to operate as a junction forming material.

Thus, there are inherent limitations placed on the manufacturing process when using the indium as a contact material as well as a junction forming material. Furthermore, there is poor control of the geometry of the resulting device since this is a straightforward alloying process.

This same type of alloying process to form a junction has been carried over to the silicon art where aluminum is used as the contact material and junction forming material. The binary phase diagram of silicon and aluminum is well known and is shown, for example, at page 133 of the aforementioned text Constitution of Binary Alloys. In the case of the aluminum-silicon binary system, there is a eutectic reaction since there is a composition of aluminum and silicon which will melt at a temperature lower than the melting temperature of either of the components. Namely, the melting point of the eutectic is approximately 577° C. which occurs at approximately 12% by weight of silicon. Because of this, if the couple is heated, it being understood that the silicon referred to here is of the n type, the melting point of aluminum will be passed so that it immediately dissolves across to a position that corresponds to approximately 20% silicon and 80% aluminum. Therefore, in this process which is barely above the melting point of the aluminum, a considerable amount of silicon is necessarily dissolved.

In practice, it has been found that the aluminum can rarely be more than 0.002" thick as contrasted to 0.015" of indium in the indium-aluminum binary system. Thus, where a eutectic alloy results, inherent limitations are placed on the alloying material so far as its contacting function is concerned as well as on the silicon wafer since a relatively large amount of the wafer is dissolved.

In this regard it should be noted that the silicon used must be of extreme purity and accordingly is extremely expensive. By way of example, a gram of purified silicon may cost more than $1.50. In the fabricating process more than 75% of this silicon may be lost so that the resulting device becomes quite expensive.

In the present invention, the pure tin is used with a previously formed junction and serves solely as a contact element which is alloyed with the silicon and adds no electrical carriers to the system.

The diffusion process for forming the junction in the silicon material is well known and does not form a part of the present invention.

Typical of diffused devices, a preselected material such as boron in gaseous form may be exposed to a silicon surface at an extremely high temperature such as 1200° C. for a relatively long time such as twenty-four hours. With this process, and because of the long times involved, a highly accurate controlled amount of penetration of the impurity into the silicon surface is achieved, and the shape of the junction will be a mirror image of the silicon surface in its initial state. Therefore, in the diffusion process, an extremely high degree of geometrical control is achieved as contrasted to the use of the alloying process for forming the junction.

In the application of the present invention, it is obvious that the junction can be formed in any manner. Thus, solid state diffusion could be used, or the junction can be formed during crystal growth as in the junctions formed by vapor phase deposition sometimes referred to as epitaxially formed crystals.

In the present invention, where a pure tin contact is provided to form a non-eutectic alloy with the silicon surface, an extremely strong bond results as compared to the plating techniques. Furthermore, and as contrasted to the prior alloying techniques which distinguish in the first instance from the invention in that they are used to form the junction, very little of the silicon is dissolved into the tin and has been measured at less than 1%.

Accordingly, the geometry of the silicon surface is relatively unaffected and substantially all of the silicon is useful in the silicon wafer.

It is accordingly a principal object of this invention to provide a method for forming a novel contact for a junction silicon device which is comprised of pure tin alloyed to the silicon surface.

The nature and objects of the invention will become apparent when taken in connection with the accompanying drawings in which.

Figure 1:
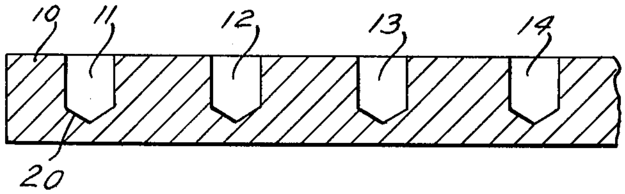
FIGURE 1 is a side cross-sectional view of a ceramic jig for use in assembling the alloyed contact of pure tin.

For illustrative purposes, a typical diffusion process for forming a diffused junction in a silicon wafer of n type silicon proceeds as follows where the novel alloyed tin contact is later alloyed to one of the diffused silicon faces. The process starts with a silicon ingot approximately 1" in diameter and 4 or 5" long of highly purified silicon. This ingot is sliced in the usual manner as with a diamond saw into slices or wafers approximately 0.015" thick. These slices are then lapped down on a lapping machine using, for example, a garnet powder to a thickness of 0.010". This lapping process is carried out for both geometry control of the wafer as well as to remove the mechanically disturbed surface areas of the wafer caused by the slicing process.

The wafers are then placed in an oven and are held in the oven in a quartz jig. A small combustion boat is also put in the oven which contains phosphorous pentoxide, and a dry oxygen source is also contained within the oven. The oven is then brought to a temperature of approximately 1150° C. for approximately one-half hour so that there is a deposition of a layer of phospho-silicate glass on the wafers. The phospho-silicate glass so deposited will act as a source for the diffusant into the silicon wafer to ultimately form an n+ area in the n type silicon wafer. The wafers are cooled and then taken out of the oven and one side is coated with a wax, while the other side of the wafer is lapped off by between 0.0015" to 0.002" so that the resultant wafer is approximately 0.008" thick. Thus, one side of the slice only retains the phospho-silicate glass coating, while the other side has the n type silicon of the wafer exposed.

A mixture of boric acid is then dissolved in methyl cellosolve which is painted on the exposed silicon surface. The methyl cellosolve is then permitted to evaporate to leave the boric oxide uniformly deposited.

The slices or wafers so treated are then stacked together into a stack with the boron surfaces adjacent one another and the phospho surfaces adjacent one another, the wafers being separated very slightly by small granules of aluminum oxide to prevent sticking. The stacks are then placed in an oven and are heated at 1260° C. for approximately sixteen hours. This process will then cause a penetration into the exposed silicon surface of the boron for a depth of approximatel 2.5 mils to form a highly accurately controlled p-n junction, while there is a phosphorous diffusion on the other side of the wafer. The resultant wafer then becomes p+ on the boron side with a large impurity concentration and an n+ structure on the other surface to form a rectifying device.

In order to remove the glass type material on the slice or wafer, the wafers are dipped in hydrofluoric acid which etches the glass away but does not attack the silicon. The surface is then given a very light sand blast and is mounted with wax and appropriately cut or diced into the small wafers for appropriate use as semi-conductor devices.

By way of example, the wafer can be cut ultrasonically with a tool using an appropriate boron carbide abrasive. The resultant individual wafer may have a diameter of 0.072" and is approximately 0.008" thick.

In accordance with the present invention, a pure tin contact is then alloyed to the surfaces of the wafer. In a preferred method of forming the alloyed contact, a ceramic jig 10 shown in side cross-sectional view in FIGURE 1 is provided which has a plurality of openings such as openings 11, 12, 13 and 14 therein. A jig in actual use may have as many as 1,000 of these openings. Each of these openings will have a diameter slightly more than 0.072" so that it can receive the silicon wafers described above which have diffused layers therein and have tapered bottoms as shown.

Figure 2:
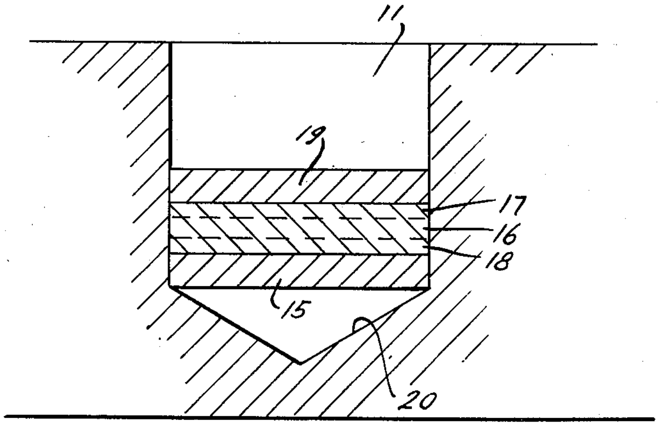
FIGURE 2 is an enlarged cross-sectional view of one of the openings of the jig of FIGURE 1 with tin wafers being carried on opposite sides of the silicon wafer prior to the alloying process.

One of the openings 11 of the ceramic jig 10 is shown in enlarged view in FIGURE 2. As is seen in FIGURE 2, a first tin wafer 15 is placed at the bottom of opening 11. Tin wafer 15 has a diameter approximately equal to the diameter of opening 11 and a thickness of approximately 0.010". The purity of this tin wafer 15 is approximately 99.999% and is fine wire pure.

The silicon wafer 16 having a diffused boron portion 17 and diffused phospho portion 18 illustrated by dotted lines is then applied immediately on top of tin wafer 15. A second tin wafer 19 which may be identical to wafer 15 is placed on top of silicon wafer 16.

The complete ceramic jig 10 of FIGURE 1 is then placed in an oven which can have either an inert atmosphere or preferably a high vacuum of less than $10^{-4}$ millimeters of mercury and is heated at about 950° C. for approximately ten minutes so that the tin of tin wafers 15 and 19 alloy with the silicon surfaces of silicon wafers 16. As indicated above, this heating operation is preferably carried out in vacuum so that unknown and unintentional impurities contained in an inert atmosphere will not be present.

When the material of wafers 15 and 19 initially melt, they will not wet the silicon surfaces in view of the unusually high surface tension of liquid tin. Thus, the liquid tin will immediately attempt to form a sphere on the top and bottom of the silicon surfaces.

Because of this, and as shown in FIGURES 1 and 2, the openings such as opening 11 in jig 10 have tapered bottoms such as tapered bottom 20 of hole 11. This tapered bottom will centrally locate the tin globule formed by wafer 15 at the center of silicon wafer 16 so that the tin will gradually wet the lower surfaces of the silicon wafer and seep outwardly.

With the forming of the bottom globule, the silicon wafer may, if desired, move down to seat on the shoulder formed by the beginning of taper 20. Thus, the upper tin globule formed by tin wafer 19 will rest on a relatively flat surface and will gradually wet the upper surface of silicon wafer 16, spreading outwardly.

Figure 3:
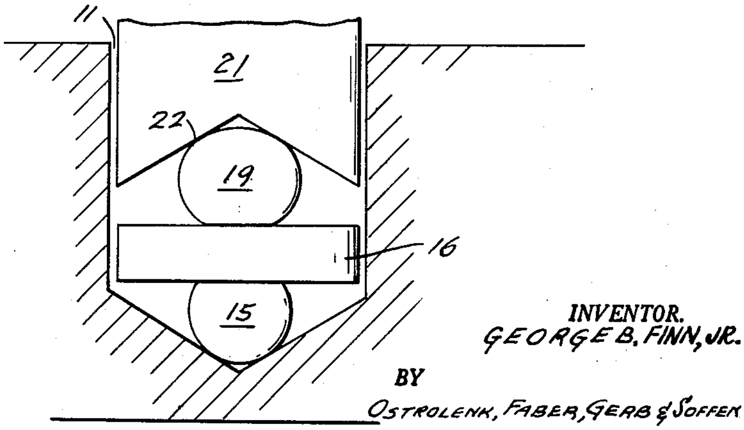
FIGURE 3 is a cross-sectional view similar to FIGURE 2, illustrating the formation of tin globules on opposite sides of the silicon wafer during the alloying process.

To assure centering of the upper tin globule during the wetting process and assuring that the lower tin globule does not act as a pivot for wafer 16 during the wetting process, a tapered weight can be used on top of wafer 19 in the manner shown in FIGURE 3. Referring to FIGURE 3, it is seen that a plunger 21 having a tapered bottom portion 22 receives and centers the tin globule formed by wafer 19 of FIGURE 3. Tapered portion 22 will center the globule 19 on the upper surface of wafer 16 during the wetting process and will prevent tilting of wafer 16.

During the alloying process, the wetting action will be dependent upon the cleanness of the surface of the silicon wafer. Thus, it is desirable to have the surface cleaned as well as possible and to work in an evacuated environment so that relatively low temperatures can be used. This will prevent excessive dissolving of the silicon. The surface tension of the tin is so controlled that the amount of silicon dissolved will be at a minimum, consistent with the amount necessary to form a bond with the tin.

As an unexpected advantage of the invention, it has been found that the surface tension of the tin will prevent wetting over the edge of the wafer surface. Thus, precisely the full surface of the wafer is completely coated. This is to be contrasted to previously used contacts where the total area of the junction is not covered since it was necessary to physically jig the surface during the formation of the contact so that a part of the junction surface is covered.

Once the alloying process is completed, the ceramic jig 10 is unloaded as by dumping. The individual wafers are then placed in a soldering fixture which holds the wafer adjacent a pair of leads which are to be connected to the alloyed tin surfaces of wafer 16. These leads are of any desired appropriate material such as copper or nickel, and the assembly is heated in a hydrogen bell jar to approximately 300° C. where the leads are secured by the tin to the silicon surface.

The next step in the process is an etching process which takes place in an extremely clean environment where the edges of the silicon wafer are etched to assure a clean surface at the edges of the silicon surfaces and removes contaminants such as disturbed silicon around the rim of the wafer. A caustic etch is preferably used for this which uses an aqueous sodium hydroxide solution.

After the etching process, the device is kept warm and is immersed in a high dielectric resin such as a silicone varnish of the type known as Dow Corning #997 silicone varnish. The devices so coated are then placed in an oven so that the resin finish is cured in the usual manner. A further finish may then be applied of the same nature for increasing the mechanical strength of the device.

As a final step, the complete assembled wafer having leads extending therefrom which is embedded in a high dielectric resin is placed in an epoxy sleeve formed of a hollow epoxy cylinder, and the open ends of the cylinder are then filled with an epoxy resin so that a complete unitary molded structure is provided.

In the foregoing the present invention has been described only in connection with preferred embodiments thereof. Many variations and modifications of the principles of the invention within the scope of the description herein are obvious. Accordingly, it is preferred to be bound not by the specific disclosure herein but only by the appended claims.

I claim:

1. In a method of manufacturing a silicon semi-conductor device including a silicon wafer having at least one diffused junction therein, the improvement which comprises:

(*a*) Placing a first wafer constituted of pure tin in an opening in a jig, said opening having a tapered bottom;

(*b*) Depositing the silicon wafer in the jig opening, said silicon wafer including a first surface in abutment with the first tin wafer;

(*c*) Depositing a second wafer constituted of pure tin in the jig opening,said silicon wafer including a second surface in abutment with the second tin wafer;

(*d*) Positioning a guide member having a tapered bottom portion centrally of and in abutment with the second tin wafer;

(*e*) Heating said jig until the pure tin wafers liquefy, the first tin wafer forming a globule disposed in the tapered bottom of said jig opening and positioned thereby centrally of the first abutting surface of the silicon wafer, and the second tin wafer forming a globule disposed in the tapered bottom portion of said guide member and positioned thereby centrally of the second abutting surface of the silicon wafer;

(*f*) Continuing to heat the jig until said globules of liquid tin wet said first and second abutting surfaces of the silicon wafer and alloy therewith over substantially the entire areas thereof; and (*g*) Thereafter cooling the silicon wafer and the tin contacts alloyed therewith and removing the resulting contact-bearing silicon semi-conductor device from said jig.

2. The method as defined in claim 1, in which the jig containing the silicon and tin wafers is heated in step (*e*) at a temperature of 950° C. for a period of approximately 10 minutes within an oven maintained under a vacuum of less than $10^{-4}$ millimeters of mercury.

References Cited in the file of this patent

UNITED STATES PATENTS

| | | |
|---|---|---|
| 2,788,299 | Dawson et al. | Apr. 9, 1957 |
| 2,881,103 | Brand et al. | Apr. 7, 1959 |
| 2,930,948 | Eannarino et al. | Mar. 29, 1960 |
| 2,945,285 | Jacobs | July 19, 1960 |
| 2,964,431 | Kalish et al. | Dec. 13, 1960 |

OTHER REFERENCES

IBM Technical Disclosure Bulletin, volume 2, No. 4, December 1959, pages 79–81.